United States Patent [19]

Ishioka

[11] Patent Number: 5,216,426
[45] Date of Patent: Jun. 1, 1993

[54] INTEGRATING ADC HAVING MEMORY CAPACITOR CONNECTED TO INTEGRATOR OUTPUT AND ONE COMPARATOR INPUT AND VOLTAGE DIVIDER CONNECTED TO INTEGRATOR OUTPUT AND THE OTHER COMPARATOR INPUT

[75] Inventor: Masakiyo Ishioka, Koushoku, Japan

[73] Assignee: Yokogawa Instruments Corporation, Koushoku, Japan

[21] Appl. No.: 841,134

[22] Filed: Feb. 25, 1992

[30] Foreign Application Priority Data

Mar. 5, 1991 [JP] Japan .................................. 3-63954

[51] Int. Cl.$^5$ .............................................. H03M 1/50
[52] U.S. Cl. .................................................. 341/168
[58] Field of Search ............... 341/166, 167, 168, 169, 341/170, 128, 129

[56] References Cited

U.S. PATENT DOCUMENTS

| | | | |
|---|---|---|---|
| 3,674,937 | 7/1972 | Bellanger et al. | 341/168 X |
| 3,818,246 | 6/1974 | Hellwarth et al. | 341/168 X |
| 4,034,364 | 7/1977 | Fukuda et al. | 341/167 X |
| 4,117,477 | 9/1978 | Zitelli et al. | 341/167 |
| 4,243,975 | 1/1981 | Masuda et al. | 341/168 |
| 4,567,465 | 1/1986 | Komiya | 341/168 |

*Primary Examiner*—Sharon D. Logan
*Attorney, Agent, or Firm*—Moonray Kojima

[57] ABSTRACT

An integrating analog-to-digital converter comprising an integrator, a memory capacitor for memorizing the potential of an integrated output from the integrator, a comparator for comparing the potential memorized in the memory capacitor and the potential of the integrated output divided by a set of potential dividing resistances, a clock pulse generating circuit, a counter for counting the period until the integrated output of the reference voltages passes through a reference level using clock pulses, and a reversible counter for counting the period from when the integrated output passes through the reference level to when the integration is completed, by the clock pulses, and for adding its value to the counted value from the counter as low order digits; wherein the number of digits of AD conversion is increased, and high conversion accuracy and high resolution are realized by enlarging the time period from the reference level crossing point to a clock pulse immediately after the crossing in the reference voltage integrating period, and by counting the time using the clock pulses.

1 Claim, 5 Drawing Sheets

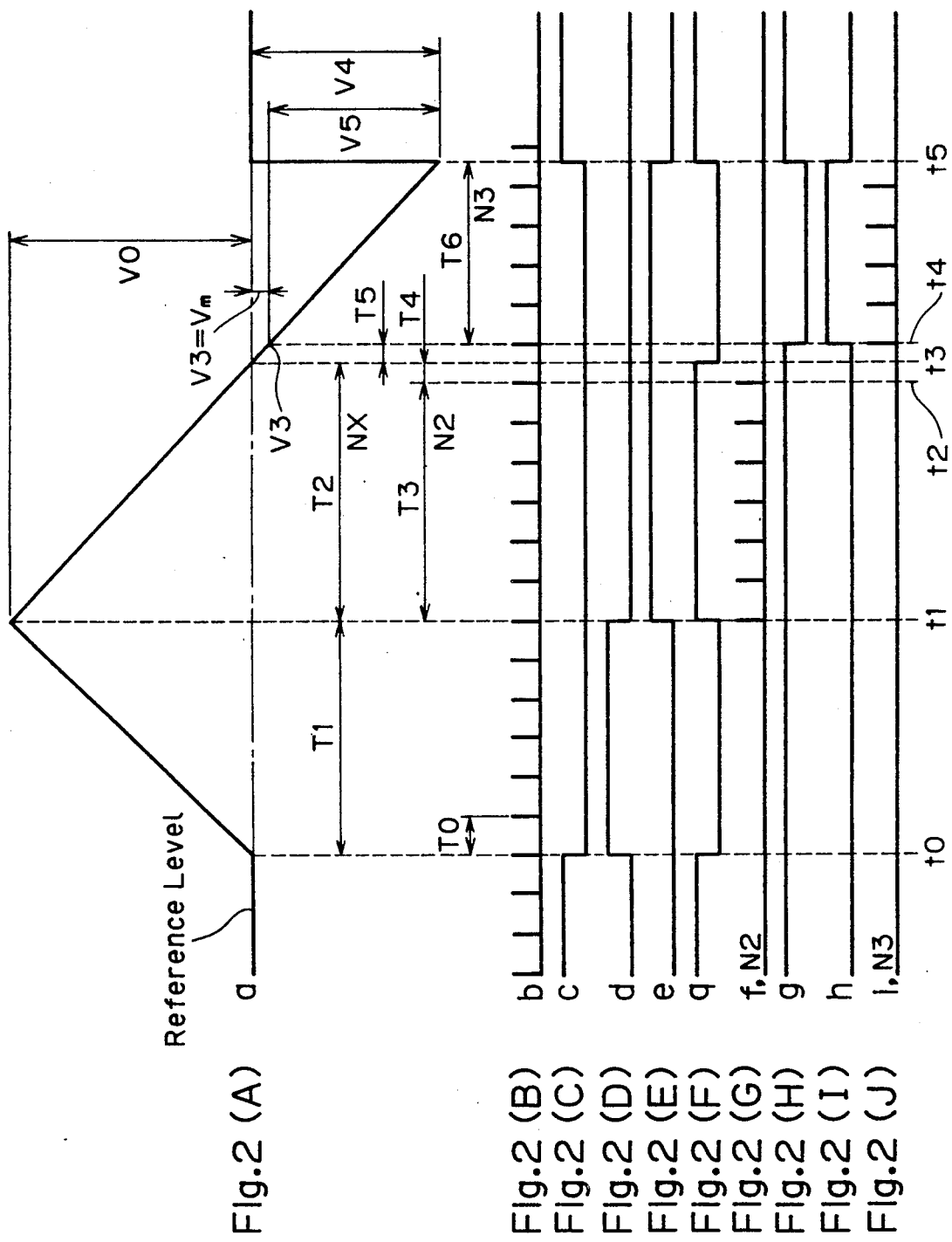

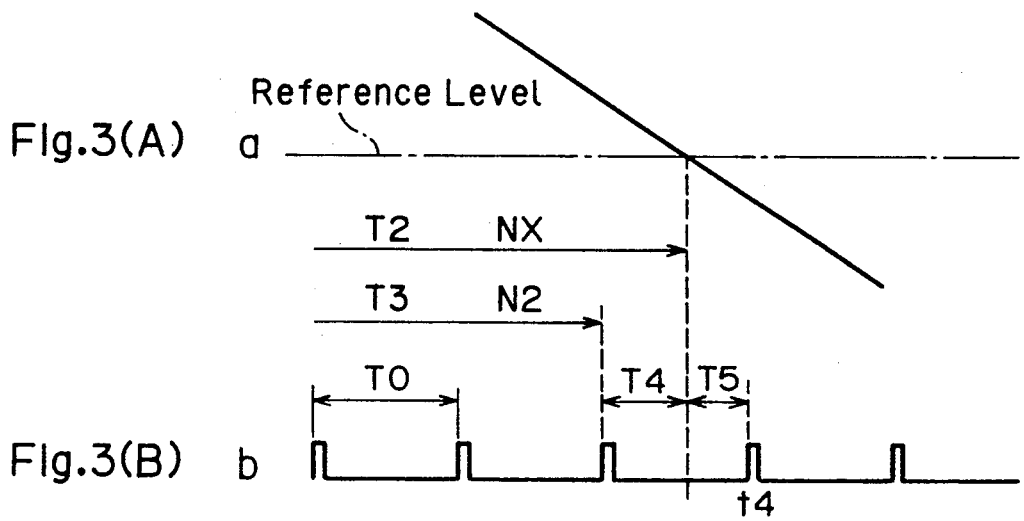
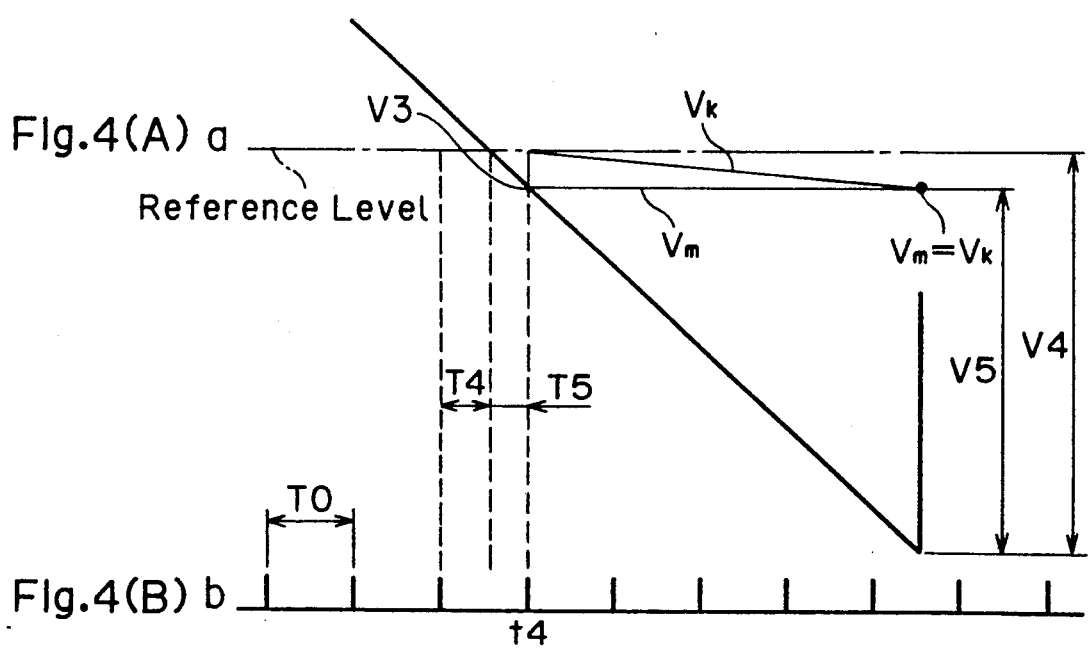

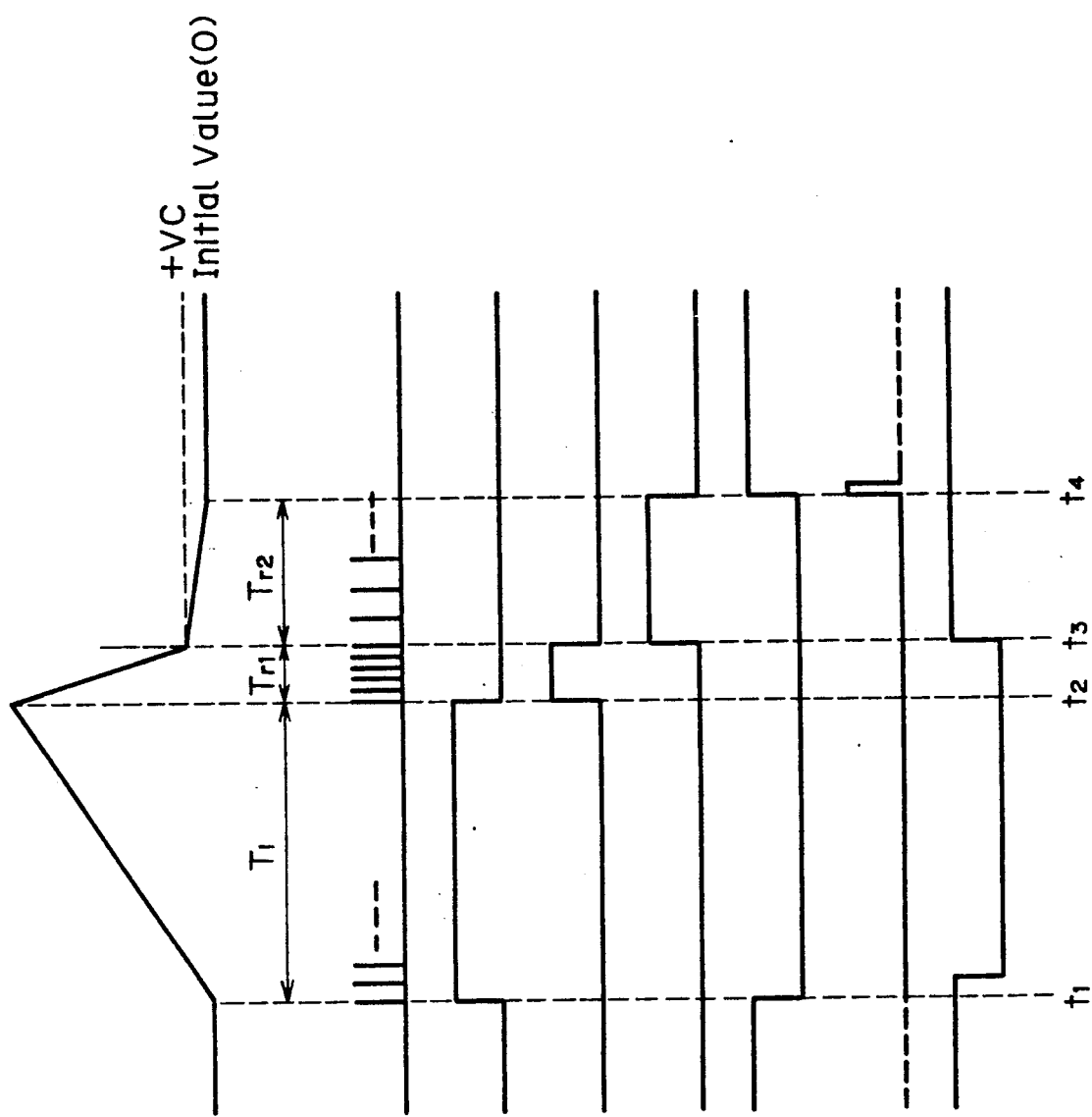

INTEGRATING ADC HAVING MEMORY CAPACITOR CONNECTED TO INTEGRATOR OUTPUT AND ONE COMPARATOR INPUT AND VOLTAGE DIVIDER CONNECTED TO INTEGRATOR OUTPUT AND THE OTHER COMPARATOR INPUT

BACKGROUND OF THE INVENTION

1. Field of the Invention

This invention relates to an analog-to-digital converter, such as used for digital voltmeters, digital ohmmeters, and the like; and more particularly, to improvements in the conversion accuracy and resolution of a double integrating analog-to-digital converter.

2. Description of the Prior Art

There are various conventional analog-to-digital (known as AD) converters which are enhanced to obtain high accuracy and high resolution, such as the triple integrating AD converter. FIG. 5 depicts one example of a triple integral AD converter; and FIGS. 6(A)–6(H) are time charts useful in explaining the operation thereof. In FIGS. 6(A)–6(H), in the initial state (i.e. the state until t1) switches S1, S2, and S3 (of FIG. 5) are switched OFF, a reset switch SR is switched ON and an integrator 14 is reset. Then, switch S1 is switched ON for a predetermined period of time Ti (which is from time t1 to time t2) to integrate a voltage to be measured $-Vi$. The output of integrator 14 increases in the positive direction as shown in FIG. 6(A). Time period Ti is controlled by counting clock pulses using a counting and switching control circuit 22. Upon reaching time t2, switch S1 is switched OFF and switch S2 is switched ON to integrate a first reference voltage $+Vr1$ having a reversed polarity to voltage $-Vi$ to be measured. During this period, the time is measured utilizing high speed clock pulses. When the output of integrator 14 reaches a first detection level $+VC$, it is detected by first level detector 19 as shown in FIG. 6(H) and switch S2 is switched OFF and switch S3 is switched ON in synchronism with the clock pulses.

Thus, a second reference voltage $+Vr2$, which is lower than first reference voltage $+Vr1$, is supplied to integrator 14 to be integrated. The output of integrator 14 decreases toward the initial value 0 V with a gentle slope. During period Tr2 (from t3 to t4), the time is measured by low speed clock pulses. When the output of integrator 14 reaches 0 V, it is detected by a second level detector 20 and switch S3 is switched OFF, and reset switch SR is switched ON to end the AD conversion.

Since the amount of charge accumulated during the period t1 to t2 and the amount of charge released durign the period t2 to t4 (i.e. Tr1+Tr2) are equal, the digital value of the voltage to be measured can be found by taking the weighted sum of the number of pulses in period Tr1 and those in period Tr2.

In short, this triple integrating AD converter of FIG. 5 is a system which divides integrating periods by the reference voltages into integration of the first reference voltage and that of the second reference voltage and to integrate roughly in the first half and finely in the second half by making the slope gentle.

However, this conventional system has various disadvantages. For example, it requires two types of clock pulses, two different types of reference voltages having different voltages, and another comparator and comparison level for changing the slope of integration in addition to the comparator for detecting the crossing of the reference level.

SUMMARY OF THE INVENTION

Accordingly, it is an object of the invention to overcome the aforementioned and other deficiencies and disadvantages of the prior art.

Another object is to provide an integral AD converter which allows an increase in the number of digits of AD conversion and which realizes high conversion accuracy and high resolution.

A further object is to provide an integral AD converter wherein the time between when a clock pulse crosses the reference voltage level and the next clock pulse is enlarged without causing the frequency of the clock pulses to be changed.

The foregoing and other objects are attained by the invention which comprises an integrator for integrating a voltage to be measured and a reference voltage having a polarity which is reverse that of the polarity of the voltage to be measured; a memory capacitor connected to an output of the integrator and which is disconnected when the integrated output is synchronized with a clock pulse after passing through a reference level, to memorize the potential of the integrated output at the time when it is synchronized with a clock pulse; potential dividing resistors connected to the output of the integrator and divide the integrated output by a predetermined ratio; a comparator for detecting whether the integrated output has passed through the reference level, for comparing successively the potential memorized in the memory capacitor, and a potential of the integrated output divided by the potential dividing resistor, and for outputting a signal for terminating the integration when those potentials coincide; a clock pulse generating circuit for generating clock pulses; a counter for counting the period until the integrated output when the reference voltage is connected, passes through the reference level, by using the clock pulses; a reversible counter for counting the period from when the integrated output passes through the reference level to when the integration is finished, using the clock pulses, and for adding its value to a counted value of the counter as low order digits; and a control circuit for controlling the supply of voltage to be measured or of the reference voltage to the integrator, supply of the output of the integrator to the memory capacitor, supply of a predetermined input voltage to the comparator and supply of the clock pulses to the counter and the reversible counter.

In the invention, integration by the voltage to be measured is carried out in the first integrating period and after that, integration by the reference voltage is carried out until the integrated voltage reaches the reference level. The integrating period of the reference voltage is counted by the reference clock pulses, and there may be an error in the value counted at this time. That is, the time from the time when the integrated voltage actually crosses the reference level to the time of the final clock pulse counted becomes an error. In the invention, the time which corresponds to the error is enlarged and is counted using the clock pulses to enhance conversion accuracy and resolution.

BRIEF DESCRIPTION OF THE DRAWINGS

FIGS. 2(A)-2(J) are time charts which are useful in the explanation of the operation of the FIG. 1 embodiment.

FIGS. 3(A), 3(B) are partially enlarged diagrams of the time charts of FIGS. 2(A)-2(J).

FIGS. 4(A), 4(B) are partially enlarged diagrams of the time charts of FIGS. 2(A)-2(J).

FIGS. 6(A)-6(H) are time charts for explaining operation of the system of FIG. 5.

DETAILED DESCRIPTION OF THE PREFERRED EMBODIMENTS

Figure 1:
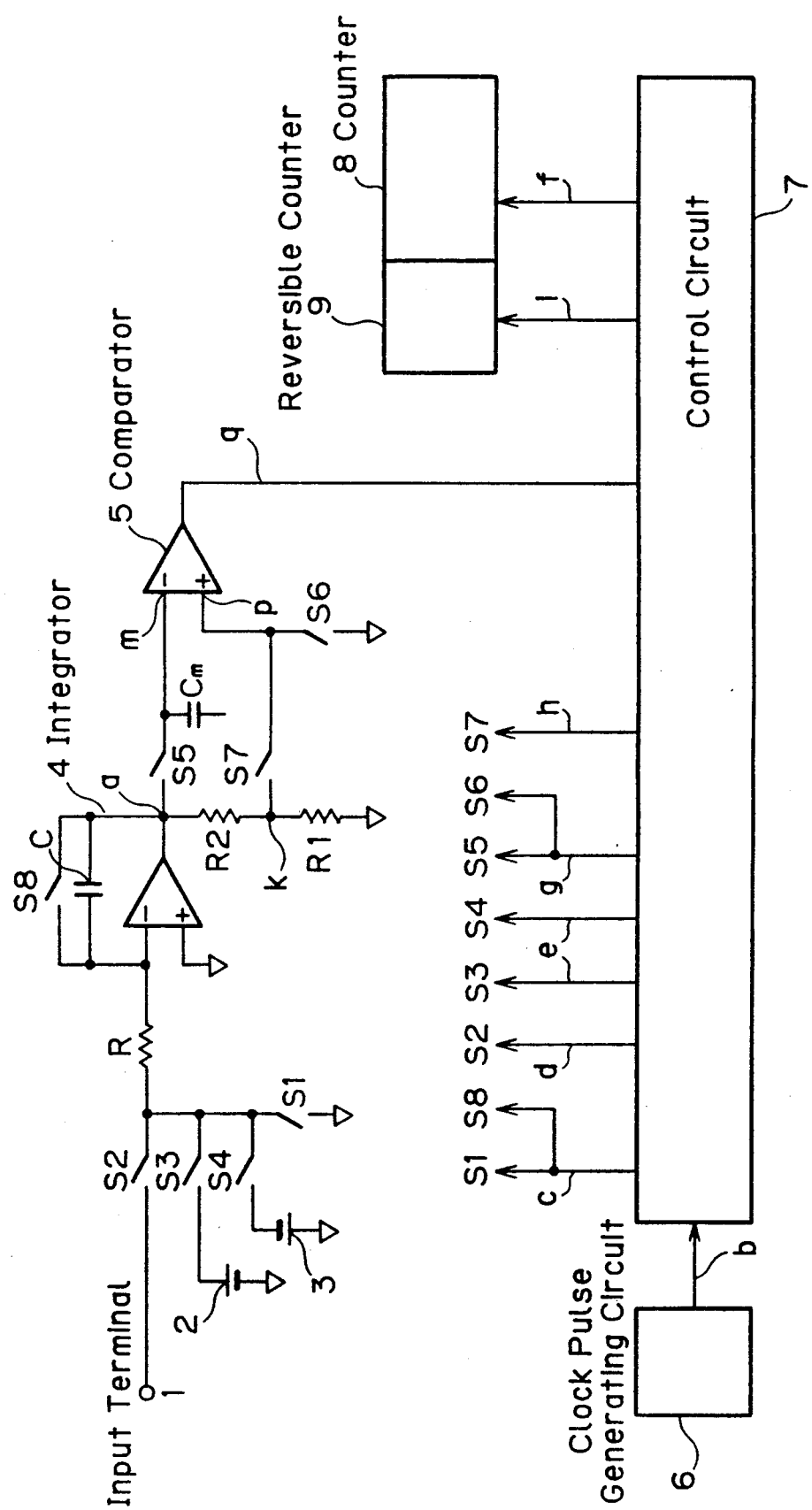
FIG. 1 is a diagram depicting an illustrative embodiment of the invention.
Figure 5:
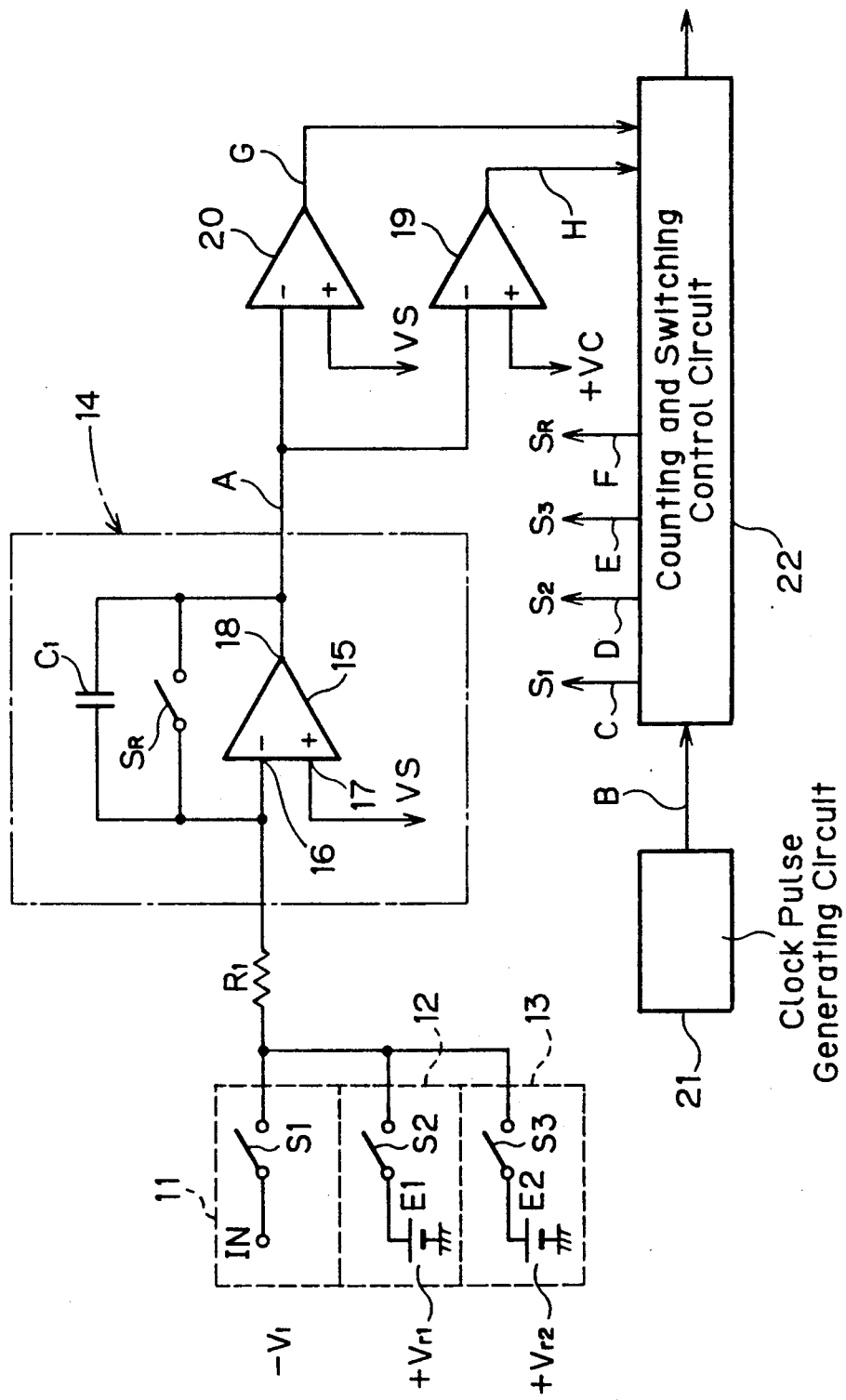
FIG. 5 is a diagram depicting an example of a prior art triple integral AD converter.

FIG. 1 depicts the main parts of an AD converter comprising an input terminal 1 through which a voltage to be measured Vx is applied through switch S2; an integrator 4; a comparator 5; a clock pulse generating circuit 6; a control circuit 7; a counter 8; a reversible counter 9; potential dividing resistor $R_1$, $R_2$; and a memory capacitor Cm. Reference voltage 2,3, being equal and of appropriate polarities, are applied through switches 3,4.

Integrator 4 comprises an integrating resistor R at the input end, an amplifier A provided with a parallel connection circuit comprising an integrating capacitor C and a reset switch S8 at its feedback path. At the input side of integrating resistor R, common terminal, voltage Vx to be measured, reference voltages 2,3, are connected respectively through switches S1, S2,S3 and S4. The ON and OFF operations of switches S1, s2, S3, and S4 are controlled by controller 7.

The potential dividing resistors R1,R2 are connected in series and the other end of resistor R2 is connected to an output end of integrator 4 and the other end of resistor R1 is connected to the common. Memory capacitor Cm is connected to the output end of integrator 4 through switch S5.

One input end of comparator 5 is connected to memory capacitor Cm. The other input end of comparator 5 is connected via switch S7 to a common connecting point K of the potential dividing resistors R1,R2, and to the common terminal through switch S6. Comparator 5 outputs a binary signal which corresponds to a relationship of magnitude between signals applied to its two input terminals.

Control circuit 7 receives clock pulses b (see FIG. 2(B)) supplied from clock pulse generating circuit 6 and controls each switch and outputs clock pulses to be counted in counter 8 and reversible counter 9.

Referring next to the time chart of FIGS. 2(A)-2(J), operation of the embodiment of FIG. 1 is as follows. In the initial state before start of conversion, the voltage to be measured Vx is applied to input terminal 1, switches S1,S8, S5 and S6 are switched ON and all other switches are switched OFF. The switches are controlled by control circuit 7.

Switch S1 and S8 are switched OFF and switch S2 is switched ON at the start of conversion. Then, the voltage to be measured Vx is applied to integrator 4 via switch S2 and integrating resistor R, and integration is carried out for a predetermined period of time, i.e., during T1. This period is called the "first integrating period".

At the end of the first integrating period, an integrated output V0 is calculated by using the following expression (1).

$$V0 = -Vx \cdot T1(R \cdot C) \tag{1}$$

The predetermined time T1 is determined by control circuit 7 counting the clock pulses b from clock pulse generating circuit 6. When the number of clock pulses is N1 and the period of the clock pulses b is T0, T1 is calculated as follows.

$$T1 = N1 \times T0 \tag{2}$$

If expression (2) is substituted for expression (1), it becomes $$V0 = -Vx(N1 \times T0)/(R \cdot C) \tag{3}$$

Upon ending the integration of the predetermined period of time T1, switch S2 is switched OFF and either Switch S3 or S4 is switched ON and either reference voltage 2 or 3, having a reverse polarity to that of the voltage to be measured Vx is connected to resistor R. Control circuit 7 judges which one of switches S3,S4 should be switched ON in accordance with an output from comparator 5.

The selected reference voltage 2 or 3 is connected to integrator 4 through integrating resistor 4 and is integrated. At this time, the slope of the integration is reversed from that in the first integrating period T1. Comparator 5 detects when the integrated output passes through the reference level (see FIG. 2(A)). This period of time from start of integration of reference voltage 2 or 3 to the passing of the integrating reference voltage through the reference level shall be called the "second integrating period" T2.

Where the reference voltage is Vr, the reference level is 0, and the time width of the second integrating period is T2. The reference level 0 is calculated as follows.

$$0 = V0 - (-Vr) \cdot T2/(R \cdot C) \tag{4}$$

Therefore, T2 is $$T2 = -(R \cdot C) \cdot V0/Vr \tag{5}$$

When expression (3) is substituted for expression (5), it becomes $$T2 = -Vx(N1 \cdot T0)/Vr \tag{6}$$

The second integrating period is counted by counter 8 using clock pulses b from clock generating circuit 6. When the number of clock pulses b is Nx, it becomes $$Nx = T2/T0 \tag{7}$$

When expressions (6) and (7) are adjusted, Nx becomes $$Nx = Vx \cdot N1/Vr \tag{8}$$

Up to now, the operations are the same as those of the prior art double integral AD converter and expression (8) is a typical conversion formula therefor.

If T2 is as follows $$T2 = T3 + T4$$

and it is substituted for expression (7), then Nx is as follows.

$$N_x = T3/T0 + T4/T0 \tag{10}$$

T3/T0 is the number of clock pulses b having the period T0 which are applied to counter 8. If this is N2 (see FIG. 2(G)), then, the number of clock pulses Nx applied to counter 8 is $$N_x = N2 + T4/T0 \tag{11}$$

In the prior art double integral AD converter, the total number of clock pulses N2 during this second integrating period is the AD conversion amount and T4/T0 is cut off as an error since T4<T0. However, if this time width of T4 can be counted using the clock pulses b, then, accuracy is increased and the resolution is enhanced without increasing the speed of the clock pulses, i.e. frequency.

In the invention, the time width T5,(as measured in FIG. 2(A), from the time the reference level is passed by the integrating reference voltage to the time of the next clock pulse T4)is found as shown in FIGS. 3(A) and 3(B). Time width T5 is enlarged and counted using clock pulses b and T4 equivalent is found by operation to increase the accuracy and to enhance resolution.

The relationship of T4 and T5 is as follows $$T4 = T0 - T5 \tag{12}$$

Therefore, it becomes $$T5 = T0 - T4 \tag{13}$$

The enlarging of T5 and use of clock pulses b are as follows. Following the second integrating period T2 (of FIG. 2(A)), the integration by reference voltage 2 (or 3) is continued. This is called the "third integrating period". At the point where it is synchronized with clock pulse b after the integrating reference voltage passes through the reference level, switch S5 is switched OFF and its potential is memorized in capacitor Cm of FIG. 1.

If the output of integrator 4 at this time is V3 and the potential memorized in capacitor Cm is Vm, Vm becomes $$Vm = V3 \tag{14}$$

Since V3 is the integrated output of reference voltage 2 (or 3) from the reference level passing point, V3 is expressed by the following $$V3 = -Vr \cdot T5/(R \cdot C) \tag{15}$$

Then, at this time, switch S6 is switched OFF and switch S7 is switched ON and the potential dividing point k of the potential dividing resistors R1 and R2 having a potential dividing ratio of n is connected to the input p of comparator 5. The potential ratio n and the ratio of potential dividing resistances R1 and R2 are predetermined as follows.

$$n = 1 = R2:R1 \tag{16}$$

This becomes $$n = R2/R1 \tag{17}$$

The output of integrator 4 is multiplied by potential dividing ratio n at time t4 and is applied to the input p of comparator 5. Integrator 4 continuously integrates reference voltage 2 (or 3) even after the third integrating period. Comparator 5 compares the potential at potential dividing point k and potential Vm, memorized in capacitor Cm, and when the potential Vk at the dividing point k exceeds that of Vm as shown in FIGS. 4(A),4(B), the output q of comparator 5 is reversed. The period up to now is called the "fourth integrating period".

The output V4 of comparator 5 when Vk=Vm is expressed as $$V4 \cdot R1/(R1+R2) = Vm \tag{18}$$

When expressions (14), (17) and (18) are adjusted about V4, it becomes $$V4 = V3 + nV3 \tag{19}$$

The amplitude of integrator 4 at time t5 at the end of the fourth integrating period is $$V5 = V4 - V3 \tag{20}$$

When expression (19) is substituted for expression (20), V5 becomes $$V5 = nV3 \tag{21}$$

That is, output V3 of integrator 4, when it is synchronized withe clock pulse b, after passing through the reference level is enlarged by n times at the end of the fourth integrating period.

On the other hand, since the outputs of integrator 4 during this period and in the third integrating period are what are integration of reference voltage 2 (or 3), it becomes as follows $$V4 = -Vr (T5+T6)/(R \cdot C) \tag{22}$$

Amplitude V5 of integrator 4 in the T6 period (see FIG. 2(A)) is calculated from expressions (15), (20) and (22) as follows.

$$V5 = -Vr \cdot T6/(R \cdot C) \tag{23}$$

Thus, when expressions (21) and (23) are adjusted, it becomes $$n \cdot V3 = -Vr \cdot T6/(R \cdot C) \tag{24}$$

When expression (24) is substituted for expression (15), the following expression is obtained.

$$n \cdot T5 = T6 \tag{25}$$

This means that T5 can be enlarged by the potential dividing ratio n of the potential dividing resistances. The accuracy, when T5 is enlarged, depends on the dividing ratio n. The total number N3 of clock pulses having a period of T0, and gate passing clock pulses i (see FIG. 2(J)) due to this enlargement period T6 is $$N3 = T6/T0 \tag{26}$$

Then, from expressions (12), (25) and (26), the following holds.

$$T4 = T0 (n-N3)/n \tag{27}$$

This means that T4 can be counted by clock pulses b, having a period of T0, and T0/n corresponds to the speed of clock pulses b (i.e. frequency) being increased by n times. The total number of clock pulses N3 is also sent out to the reversible counter 9 to count and operate =(n−N3) and to add up by weighting N2 calculated in the previous second integrating period. The sum total Nx of digital conversion at this time is calculated as follows. When expression (27) is substituted for expression (11), it becomes $$Nx = N2 + (n - N3)/n \qquad (28)$$

When both sides are multipled by n, this becomes $$n \cdot Nx = n \cdot N2 + (n - N3) \qquad (29)$$

When the above expression is adjusted, it becomes $$n \cdot Nx = n(N2 + 1) - N3 \qquad (30)$$

Thus, Nx is weighted by n times, allowing resolution to be attained in which the lower order digit is increased by n times. That is, if n is 10 or 100, it follows that the accuracy and resolution of the AD conversion are enhanced by 10 times or 100 times.

At the end of the fourth integrating period, switch S3 or S4, which is switched ON by the reverse signal of comparator 5, is switched OFF and switches S1, S8, S5 and S6 are switched ON, to return to the inital state and to end the conversion.

Advantageously, the invention readily enhances accuracy and and resolution, and furthermore, provides the following other advantages and effects. The period of the clock pulses need not be changed. Thus, the circuit can be simplified as compared to the prior art. Also, in the invention only one comparator is needed so that further simplification is obtained. Furthermore, the resolution is enhanced without prolonging the conversion time. That is, the resolution is enhanced n times by the potential dividing resistors having the ratio n regardless of the size of the conversion digits. The time necessary for enhancing the resolution by n times is the time of n clock pulses, which is relatively small. Moreover, a plurality of reference voltages having different voltages is not necessary as in the prior art. Thus, further simplification is possible.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. An integral analog-to-digital converter comprising integrator means for integrating a voltage to be measured and a reference voltage having a polarity which is reverse a polarity of the voltage to be measured;

a memory capacitor connected to said integrator means and being disconnectible when an integrated output is synchronized with a clock pulse after passing through a reference level, said memory capacitor memorizing a potential of said integrated output at a time when said integrated output is synchronized with said clock pulse;

potential dividing means connected to said integrator means for dividing said integrated output by a predetermined ratio;

comparator means for detecting when said integrated output has passed through said reference level and for comparing successively said potential memorized in said memory capacitor and a potential of said integrated output divided by said potential dividing means, said comparator means also outputting a signal for terminating integration at a point when said memorized potential and said divided potential coincide;

clock pulse means for generating said clock pulses;

counter means for counting a first period from when said reference voltage is connected to when said integrated output passes through said reference level, by using said clock pulses;

reversible counter means for counting a second period after said integrated output passed thorugh said reference level to when said integration is completed, by using said clock pulses, and means for adding a counted value of said second period as low order digits of said reversible counter means to a counted value of said first period of said counter means; and control means for controlling application to said integrator means of said voltage to be measured or of said reference voltage, application to said memory capacitor of output from said integrator means, application to said comparator means of a predetermined input voltage, and application to said counter means and to said reversible counter means of said clock pulses;

wherein said means for adding adds the counted value of said second period as low order digits to the counted value in said first period before said integrated output passes said reference level so that accuracy and resolution of conversion are enhanced.

* * * * *